United States Patent [19]

Keizer

[11] 4,015,763
[45] Apr. 5, 1977

[54] ALIGNMENT PAWL FOR FILM-CARRIER ADVANCE MECHANISM

[75] Inventor: Alan S. Keizer, Huntingdon Valley, Pa.

[73] Assignee: The Jade Corporation, Huntingdon Valley, Pa.

[22] Filed: Dec. 5, 1975

[21] Appl. No.: 637,921

Related U.S. Application Data

[63] Continuation-in-part of Ser. No. 510,207, Sept. 30, 1974.

[52] U.S. Cl. .................................. 226/55; 226/67; 226/114; 226/143; 226/147
[51] Int. Cl.² ........................................ B65H 17/40
[58] Field of Search ............................. 226/55–58, 226/62, 67, 114, 143, 87, 147

[56] References Cited

UNITED STATES PATENTS

| 1,144,414 | 6/1915 | Holmes | 226/87 |
| 1,984,143 | 12/1934 | Kraft | 226/58 |
| 3,836,060 | 9/1974 | Steinberger | 226/143 X |
| 3,900,257 | 8/1975 | Wooley | 226/57 X |

*Primary Examiner*—Richard A. Schacher
*Attorney, Agent, or Firm*—Seidel, Gonda & Goldhammer

[57] ABSTRACT

A hitch feed assembly for automatically aligning individual lead frames at a bonding site in both the longitudinal and lateral directions is disclosed. The alignment is attained as a result of the cooperation between a plurality of chamfered pawls and the sprocket holes in the film-carrier. The pawls are chamfered along three sides in order to attain alignment in both the longitudinal and lateral directions. Significantly, the pawls come into operational contact with the sprocket holes while the lead frame film-carrier is under minimal tension so that the pressure exerted on the edges of the sprocket holes by the pawls will be minimal, thereby avoiding any deformation in the shape of the sprocket holes.

8 Claims, 6 Drawing Figures

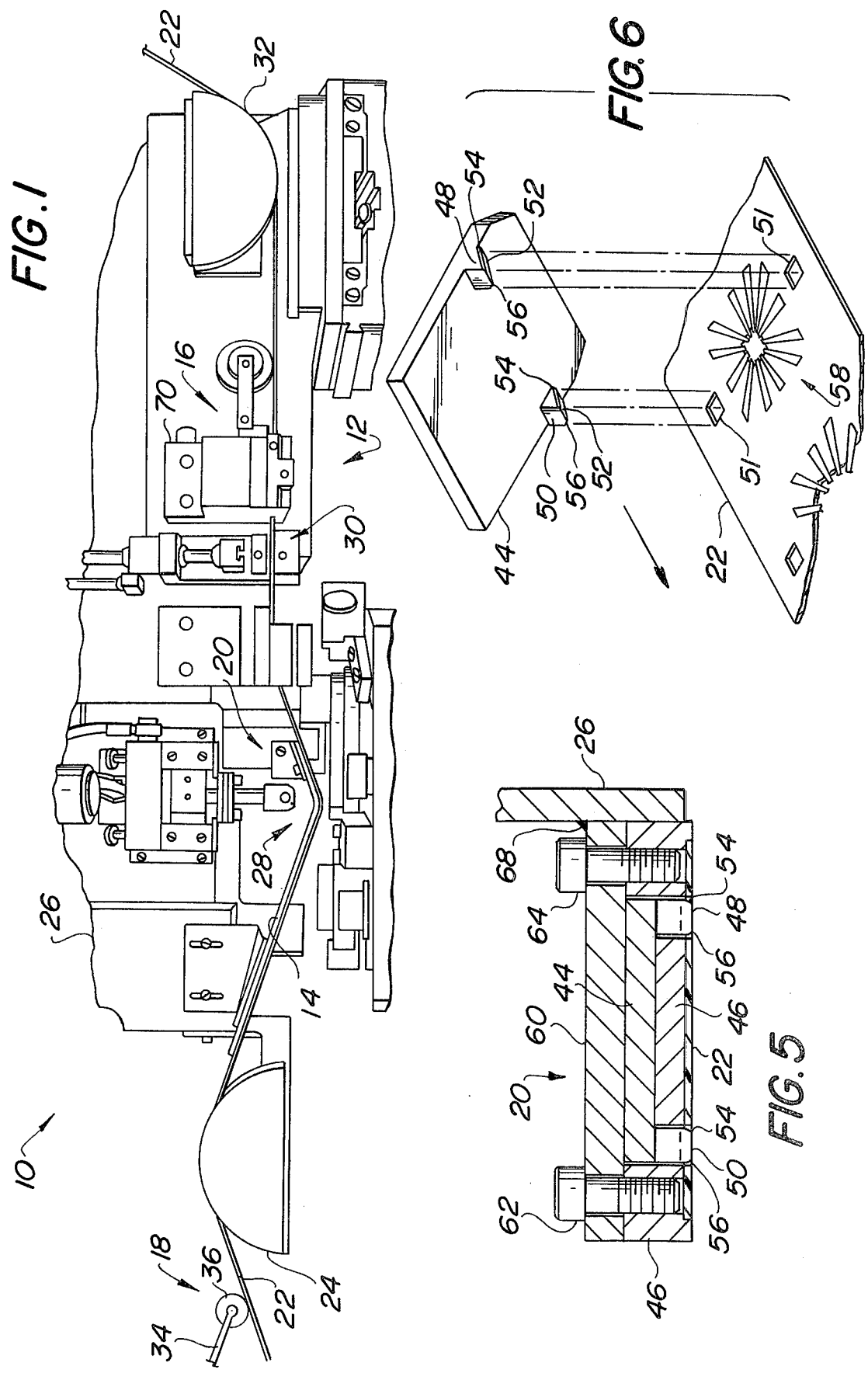

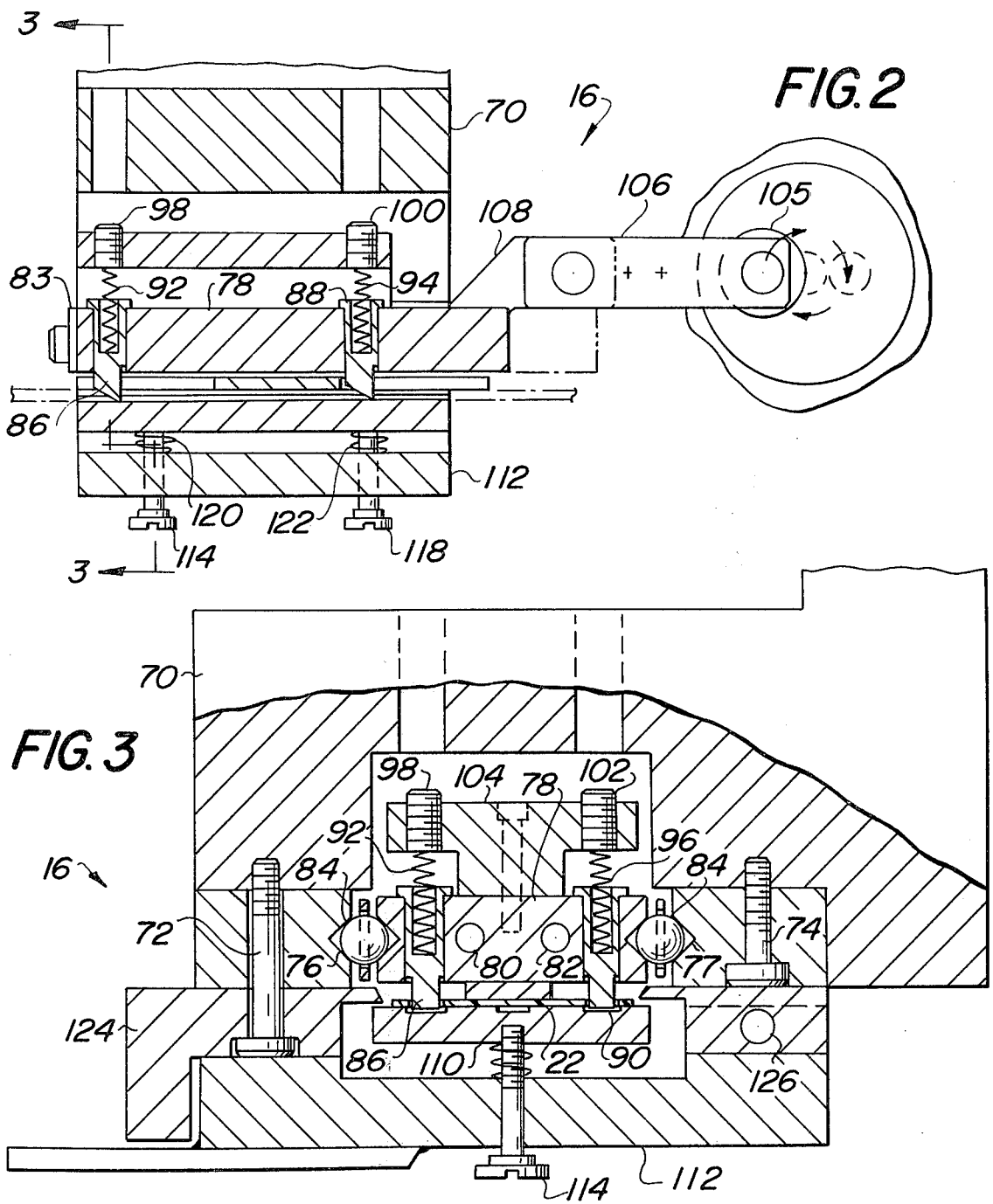

ALIGNMENT PAWL FOR FILM-CARRIER ADVANCE MECHANISM

CROSS-REFERENCE TO RELATED APPLICATIONS

The present application is a continuation-in-part of co-pending application Ser. No. 510,207 filed Sept. 30, 1974.

This invention relates to an apparatus for accurately positioning individual lead frames on a lead frame film-carrier at a bonding site. More particularly, this invention relates to an improved aligning apparatus for aligning individual lead frames in both a longitudinal and lateral direction while the film-carrier is under minimal tension.

BACKGROUND OF THE INVENTION

Semiconductor dies are manufactured with a plurality of bonding pads spaced around their periphery in a more or less uniform configuration. To complete the semiconductor die, a lead (sometimes called an inner lead) is bonded to each of the pads. These leads may then be bonded to yet another set of more rigid leads (outer leads). Thereafter, the die and leads are encapsulated. The reason for using both inner and outer leads is that the typical semiconductor die cannot withstand the head and pressure necessary to directly bond the structurally larger outer leads to the pads.

To increase production and yield, the semiconductor industry has commenced using film-carrier techniques in place of the more widely used wire-bonding technique. A film-carrier consists of a strip of film of foil having sprocket holes at its outer edges which incorporates the lead frame. The leads are simultaneously bonded to the bonding pads on the die by a bonder. The sprocket holes along the sides of the film-carrier cooperate with a plurality of pawls to advance the film-carrier after the die has been bonded and also to position the lead frame precisely over the die at the bonding site.

In co-pending application Ser. No. 510,207 filed Sept. 30, 1974, a hitch feed and guide assembly for displacing the film-carrier to sequentially position each set of leads over the die and retain the same in position for alignment and bonding is disclosed. In that application the pawls included in the hitch feed assembly only serve to position the lead frames in the longitudinal direction. Separate biasing means are provided to align the lead frame in the lateral direction. The present invention is an improvement over the disclosed hitch feed and guide assembly wherein the pawl means align the film-carrier in both the longitudinal and lateral directions at the bonding site.

SUMMARY OF THE INVENTION

The present application discloses a hitch feed assembly which automatically aligns individual lead frames at the bonding site in both the longitudinal and lateral directions. The alignment is attained as a result of the cooperation between a plurality of chamfered pawls and the sprocket holes in the filmcarrier. The pawls are chamfered along three sides in order to attain alignment in both the longitudinal and lateral directions. Significantly, the pawls come into operational contact with the sprocket holes while the lead frame film-carrier is under minimal tension. Accordingly, the pawls are not forced into the sprocket holes and the sprocket holes retain their integrity during the entire alignment operation. This represents an improvement over prior alignment pawl mechanisms utilizing shot pins wherein the shot pins wiped the edges of the sprocket holes thereby deforming them with a loss of accurary in locating the film-carrier for bonding and future processing.

BRIEF DESCRIPTION OF THE DRAWINGS

For the purpose of illustrating the invention, there is shown in the drawings a form which presently preferred; it being understood, however, that this invention is not limited to the precise arrangements and instrumentalities shown.

FIG. 1 is a perspective view of a hitch feed assembly and associated bonding apparatus.

FIG. 2 is a longitudinal sectional view of the hitch feed assembly.

FIG. 3 is a transverse sectional view of the hitch feed assembly shown in FIG. 2 and taken along the line 3—3.

FIG. 4 is a longitudinal sectional view of the filmcarrier guide assembly.

FIG. 5 is a transverse sectional view of the guide assembly shown in FIG. 4 taken along line 5—5.

FIG. 6 is an exploded view illustrating the relationship between the lead frame film-carrier and a plurality of chamfered pawls.

DETAILED DESCRIPTION OF THE PREFERRED EMBODIMENT

Referring now to the drawings wherein like numerals indicate like elements, there is shown in FIG. 1 a bonding apparatus for bonding leads to a semiconductor die designated generally as 10. The general bonding apparatus 10 is disclosed in detail in co-pending application Ser. No. 510,207 filed Sept. 30, 1974 and will not be described in detail herein. The present invention relates to the hitch feed assembly 12.

The hitch feed assembly 12 comprises generally a film track 14, a feed means 16, a biasing means 18 and a guide assembly 20. A lead frame film-carrier 22 (see FIG. 6) is fed from a reel (not shown) over the guide 24 mounted on frame structure 26. The lead frame film-carrier 22 travels along the film track 14, past the bonding site 28, through the guide assembly 20, through the punch assembly 30, through the feed means 16, and over the guide 32 to the take-up spool (not shown). The film track 14, feed means 16, and guide 32 are all mounted on frame structure 26. The feed and take-up mechanisms have not been shown since they are conventional and can be modified as desired to perform their respective functions. The feed and take-up mechanisms are preferably motor driven reels which operate independently of each other on a demand basis. More particularly, each is designed to feed or take up the film-carrier 22 whenever a predetermined amount of slack occurs therein.

The idler arm 34 of biasing means 18 supports a weighted idler wheel 36 which constantly bears against the film-carrier 22 thus maintaining it under tension. This tension tends to draw the film-carrier 22 back toward the feed reel for the purpose explained in more detail below. Significantly, the tension provided by the weighted idler wheel is minimal when compared to the tension provided by feed means 16 when feed means 16 advances film-carrier 22. For example, the tension provided by weighted idler wheel 36 may be one-fourth the tension provided by feed means 16 when advancing film-carrier 22.

FIG. 4 is an enlarged partial sectional view of the film track 14 and the guide assembly 20. FIG. 5 is an enlarged transverse sectional view which illustrates details of guide assembly 20. As shown in FIG. 4, the film track 14 is provided with a window 38 through which a bonding tool 40 may pass to apply heat and pressure to individual dies 42. The manner in which bonding tool 40 bonds individual lead frames on film-carrier 22 to individual dies 42 can be better understood with reference to co-pending application Ser. No. 510,207 filed Sept. 30, 1974.

The function of guide assembly 20 is to precisely position individual lead frames on lead frame film-carrier 22 at the bonding site 28 both prior to and during the bonding operation. The guide assembly 20 includes a guide block 44 with a guide 46 defining a channel for the film-carrier 22. A pair of pawls 48, 50 (see FIG. 6) extend downwardly from the guide block 44 for cooperative engagement with sprocket holes 51 in lead frame film-carrier 22.

As best seen in FIGS. 5 and 6, pawls 48 and 50 are chamfered along a first plane 52 which intersects film-carrier 22 along a line perpendicular to the forward longitudinal direction of movement of film-carrier 22 preferrably at an angle of approximately 15°. As used herein, the forward longitudinal direction of film-carrier 22 is the direction of advance of film-carrier 22; that is, the direction extending from left to right in FIG. 1. When so beveled, pawls 48, 50 freely permit film-carrier 22 to advance in the forward longitudinal direction extending from the bonding site to the take-up reel but prevent film-carrier 22 from retracting in the reverse longitudinal direction extending from the take-up reel to the bonding site once the pawls have come into operational engagement with sprocket holes 51.

The function of pawls 48 and 50 is to precisely position individual lead frames 58 in both the lateral and longitudinal directions at the bonding site. Accordingly, pawls 48 and 50 are also chamfered along second and third planes 54 and 56, respectively. Particularly, second and third planes 54, 56 intersect film-carrier 22 along lines parallel to the forward longitudinal direction of film-carrier 22 preferably at angles of approximately 15° and 345°, respectively.

It is desirable that pawls 48 and 50 be located as close as possible to the bonding site 28. By way of example, the pawls may be located approximately 600 mils from the center of the bonding site which is a distance of two lead frames for 16 mm standard format film-carrier.

As previously explained, the idler arm 34 and weighted idler wheel 36 apply a constant tension on the film-carrier 22 tending to draw it back towards the feed or input side of the bonding site. As described below, the feed means 16 is constructed so that it advances the film-carrier 22 slightly more than one lead frame and then releases the film-carrier 22 thereby allowing it to retrace back toward the bonding site by the amount of this over-advancement. Retraction is stopped by the engagement of pawls 48 and 50 and sprocket holes 52. This retraction allows for a full and solid engagement by the pawls 48 and 50 and assures accurate positioning with respect to the window 38 at the bonding site.

As best shown in FIG. 5, guide block 44 is wedged between guide 46 and support member 60 which are held together by appropriate fasteners 62 and 64. Support member 60 is in turn fastened to frame structure 26 by a spot weld 68.

The feed means 16 is illustrated in detail in FIGS. 2 and 3. As previously indicated, its function is to sequentially advance the film-carrier 22 from lead frame to lead frame. This is accomplished accurately by means of a set of reciprocating pawls which sequentially engage the sprocket holes in film-carrier 22 and advance it as required. The feed means 16 includes a mounting base 70 that is fixed to the frame structure 26. Cap screws 72 and 74 support an outer race 76 on the base 70. The shuttle 78 is retained for reciprocatory motion within the outer race 76 by the rails 80 and 82 which are held in position by the retaining cap 83. Bearings 84 are positioned between the outer race 76 and inner race 77.

Four pawls (three of which are shown) 86, 88, and 90 extend through bores in shuttle 78. The pawls 86–90 are normally biased to the position shown in FIGS. 2 and 3 by the springs 92, 94 and 96 which are retained in position by means of the set screws 98, 100 and 102 on the retaining rail 104, which is fixed to the top surface of the shuttle 78. Set screws 98, 100 and 102 set the force on the pawls 86, 89 and 90 so that there is just sufficient force to overcome sliding friction and normally maintain them as shown in the drawings. The flanges on top of the pawls 86-90 limit their extension to just below the sprocket holes in film-carrier 22.

The shuttle 78 is reciprocated by means of a crank mechanism including a motor driven connecting pin 105, a link 106 and connecting block 108 fixed to the shuttle 78. The link 106 converts rotary motion of the pin 105 to reciprocatory motion of the shuttle 78.

The film-carrier 22 is held in position within the feed means 16 by means of a spring plate 110 mounted on a hinge plate 112 by means of the guide pins 114, 118 and springs 120, 122. Hinge plate 112 is hinged to the support track 124 by a hinge pin 126 and may be swung open so that the film-carrier 22 can be loaded into the feed means 16.

As shown in FIG. 2, the pawls 86, 88 and 90, as well as the pawl which is not shown, are beveled at their distal end so that they readily move out of the sprocket holes after advancing the film and returning to the home position. The shuttle 78 is shown in the home position in FIGS. 2 and 3. As such, it engages the film-carrier 22 and the sprocket holes 51 and advances it by a distance slightly greater than the distance between adjacent lead frames 58. As it returns to the home position, the pawls are out of the sprocket holes allowing the film-carrier 22 to retrace slightly to be engaged by the pawls 48 and 50 in the guide assembly. The spring plate 110 exerts a small constant force on the bottom of film-carrier 22 and it is advanced. This causes it to positively engage the bottom of shuttle 78 and the pawls supported thereby. At the same time, the spring plate 110 accommodates any irregularity in the film-carrier such as, for example, increased thickness caused by splices.

The feed means 16 is driven by a motor (not shown) and is controlled by a photo-electric detector that detects the home position by sensing appropriate markings on the shaft of the motor. It should be understood that the crank for driving the shuttle 78 is exemplary only. The drive mechanism could be other well-known apparatus for reciprocating the shuttle. Some examples are an air cylinder or solenoid. The advantage of the crank mechanism described is that the acceleration and deceleration can be conveniently controlled by moving the film-carrier without damaging it.

The feed mechanism 16 is energized to advance the tape in accordance with a controlled sequence. The sequence is determined by electronic control circuitry 5 which forms no part of the present invention and hence is not described herein. It is sufficient to state that such circuitry can be of any convenient design for directing the sequential operation of the bonding apparatus.

In summary, the feed means 16 intermittently overadvances the film-carrier 22 in a forward longitudinal direction and then releases the film-carrier whereby the film-carrier is drawn back towards the bonding site due to the slight tension provided by biasing means 18. When the film carrier 22 has moved in the reverse longitudinal direction in amount equal to the overadvance by the feed means 16, pawls 48 and 50 engage sprocket holes 51 thereby accurately positioning an individual lead frame in both the lateral and longitudinal direction at the bonding site. Significantly, pawls 48 and 50 come into operational engagement with sprocket holes 51 while film-carrier 22 is under the minimal tension provided by biasing means 18. As a result, the pressure exerted on the edges of sprocket holes 51 by pawls 48 and 50 will be minimal thereby avoiding any deformation in the shape of sprocket holes 51 which would impair the accuracy with which film-carrier 22 is positioned by pawls 48 and 50.

The present invention may be embodied in other specific forms without departing from the spirit or essential attributes thereof and, accordingly, reference should be made to the appended claims, rather than to the foregoing specification as indicating the scope of the invention.

What is claimed is:

1. Apparatus for sequentially positioning individual lead frames on a lead frame film-carrier at a bonding site, said lead frame film-carrier having sprocket holes therein, comprising;

means for guiding a lead frame film-carrier to and from a bonding site;

feed means for intermittently advancing said film-carrier in a forward longitudinal direction;

biasing means for biasing said film-carrier in a reverse longitudinal direction opposite to the direction of advance by said feed means, said biasing means placing said film-carrier under minimal tension;

pawl means cooperating with said sprocket holes for accurately positioning individual lead frames in both the lateral and longitudinal directions at the bonding site, said pawl means being stationary with respect to said film-carrier; and said feed means including means for over-advancing said film-carrier in the forward longitudinal direction from a home position and then releasing said film-carrier so that said biasing means moves said film-carrier in the reverse longitudinal direction until said pawl means engage said sprocket holes thereby positioning said film-carrier at the bonding site while said film-carrier is under minimal tension.

2. Apparatus in accordance with claim 1 wherein said pawl means are chamfered along a first plane intersecting the path of said film-carrier in the area adjacent said pawl means along a line perpendicular to the direction of forward movement of said film-carrier.

3. Apparatus in accordance with claim 2 wherein said first plane intersects the path of said film-carrier at an angle of approximately 15°

4. Apparatus in accordance with claim 1 wherein said pawl means are chamfered along second and third planes intersecting the path of said film-carrier in the area adjacent said pawl means along lines parallel to the direction of said forward movement of said film carrier.

5. Apparatus in accordance with claim 4 wherein said second and third planes intersect the path of said film-carrier in the area adjacent said pawl means at an angle of approximately 15° and 345°, respectively.

6. Apparatus in accordance with claim 1 wherein said pawl means are chamfered along a first, second and third plane, said first plane intersecting the path of said film-carrier in the area adjacent said pawl means along a line perpendicular to the direction of forward movement of said carrier, said second and third planes intersecting the path of said film-carrier in the area adjacent said pawl means along the lines parallel to the direction of said forward movement of said film-carrier.

7. Apparatus in accordance with claim 6 wherein said first plane intersects the path of said film-carrier in the area adjacent said pawl means at an angle of approximately 15°, and wherein said second and third planes intersect the path of said film-carrier in the area adjacent said pawl means at angles of approximately 15° and 345°, respectively.

8. Apparatus in accordance with claim 1 wherein said feed means includes:

a reciprocating shuttle; and spring loaded pawls depending from said shuttle for engaging the film-carrier in the sprocket holes as said shuttle is advanced in the forward longitudinal direction from the home position and for releasing said film carrier as the shuttle is returned to the home position.

* * * * *